(12) United States Patent
Choug et al.

(10) Patent No.: US 7,411,226 B2
(45) Date of Patent: Aug. 12, 2008

(54) HIGH ELECTRON MOBILITY TRANSISTOR (HEMT) STRUCTURE WITH REFRACTORY GATE METAL

(75) Inventors: Yeong-Chang Choug, Irvine, CA (US); Ronald Grundbacher, Manhattan Beach, CA (US); Po-Hsin Liu, Anaheim, CA (US); Denise L. Leung, Manhattan Beach, CA (US); Richard Lai, Redondo Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 75 days.

(21) Appl. No.: 11/115,938

(22) Filed: Apr. 27, 2005

(65) Prior Publication Data

US 2006/0244009 A1    Nov. 2, 2006

(51) Int. Cl.
*H01L 31/00* (2006.01)
*H01L 29/80* (2006.01)
*H01L 21/28* (2006.01)

(52) U.S. Cl. .................. 257/192; 257/280; 257/282; 257/283; 438/570

(58) Field of Classification Search .............. 257/192, 257/280, 282, 283; 438/570, 572
See application file for complete search history.

(56) References Cited

U.S. PATENT DOCUMENTS

| 5,359,220 | A | * | 10/1994 | Larson et al. ............... 257/378 |
| 6,020,226 | A | * | 2/2000 | Cerny et al. ................. 438/167 |
| 6,555,850 | B1 | * | 4/2003 | Sakamoto et al. ........... 257/192 |
| 6,787,826 | B1 | * | 9/2004 | Tserng et al. ............... 257/280 |
| 2002/0030202 | A1 | * | 3/2002 | Liu et al. ..................... 257/194 |

* cited by examiner

*Primary Examiner*—Howard Weiss
*Assistant Examiner*—Steven H Rao
(74) *Attorney, Agent, or Firm*—Tarolli, Sundheim, Covell & Tummino LLP

(57) ABSTRACT

An InP high electron mobility transistor (HEMT) structure in which a gate metal stack includes an additional thin layer of a refractory metal, such as molybdenum (Mo) or platinum (Pt) at a junction between the gate metal stack and a Schottky barrier layer in the HEMT structure. The refractory metal layer reduces or eliminates long-term degradation of the Schottky junction between the gate metal and the barrier layer, thereby dramatically improving long-term reliability of InP HEMTs, but without sacrifice in HEMT performance, whether used as a discrete device or in an integrated circuit.

12 Claims, 4 Drawing Sheets

HIGH ELECTRON MOBILITY TRANSISTOR (HEMT) STRUCTURE WITH REFRACTORY GATE METAL

BACKGROUND OF THE INVENTION

This invention relates generally to high electron mobility transistor (HEMT) structures and, more particularly, to HEMTs using indium phosphide (InP) and related materials. A HEMT is a type of field effect transistor (FET) in which current flow between two terminals, referred to as the source and drain terminals, is controlled by a voltage applied to a gate terminal. HEMTs are widely used in a variety of applications, but particularly as low noise amplifiers operating at microwave and millimeter wave frequencies. HEMTs may be implemented as discrete transistors or in integrated circuits, such as microwave monolithic integrated circuits (MMICs) in space, military and commercial applications.

The present invention is particularly concerned with a known disadvantage of the InP HEMT, which includes, for example, a channel layer of indium gallium arsenide (InGaAs) and a barrier layer of indium aluminum arsenide (InAlAs) formed over an InP substrate. For brevity, this structure will be referred to in this description as the InP HEMT or the 0.1 μm InP HEMT, where the designation 0.1 μm refers to the minimum feature size or geometry of the structure. An important issue for users of InP HEMTs is long term reliability, because in many applications the devices are used in space or in similar environments in which repair and replacement are not practical alternatives.

Superior microwave and millimeter wave performance of InP HEMT MMICs for space and military applications has been demonstrated and discussed in the technical literature. Moreover, this superior performance has been demonstrated for circuits operating over a range of frequencies from, for example, 44 GHz (gigahertz) to 183 GHz or higher. To warrant the reliability of InP HEMTs during lifetime operation, it is essential to demonstrate their high reliability performance when subjected to an elevated temperature lifetest. Testing at an elevated temperature for relatively short periods is an acceptable substitute for testing at normal operating temperatures for much longer periods. Accordingly, since at least as early as 1993 the elevated temperature reliability of InP HEMTs, either discrete transistors or MMICs, has been extensively investigated by researchers in various industries. As a result, high reliability performance has been demonstrated for 0.07 μm, 0.1 μm InP HEMTs, and for the metamorphic HEMT (MHEMT). These investigations together demonstrate the maturity of the InP HEMT and MHEMT technologies and the degree to which these technologies are ready for space, military and commercial applications. For example, high performance and high reliability InP HEMT low noise amplifiers operating at Q-band (30-50 GHz) for phased-array applications have been demonstrated by some of the present inventors, as described in a recent publication. (R. Grundbacher, Y. C. Chou, R. Lai, K. Ip, S. Kam, M. Barsky, G. Hayashibara, D. Leung, D. Eng, R. Tsai, M. Nishimoto, T. Block, P. H. Liu and A. Oki, "High Performance and High Reliability InP HEMT Low Noise Amplifiers for Phased-Array Applications," Technical Digest of International Microwave Symposium, pp. 157-160, 2004.)

Although supreme reliability performance of InP HEMTs has been demonstrated in industry, it has been found that the reliability performance varies from company to company. The variations of reliability performance have been attributed to several different degradation mechanisms, including fluorine contamination, ohmic contact degradation, gate metal stacks, layer structure, bias dependence, variation of gate recess depth, and gate metal sinking. It appears, therefore, that the reliability performance and the degradation mechanisms strongly depend on the process techniques employed in a particular InP HEMT technology. Accordingly, it is important to identify the degradation origin of InP HEMTs on the various established process techniques in order to further improve the reliability performance. Ideally, if the origin of InP HEMT performance degradation can be reliably identified there is a significant need to provide an InP HEMT structure that improves the reliability performance of InP HEMTs, regardless of their field of application. The present invention is directed to these ends.

SUMMARY OF THE INVENTION

The present invention developed from the recognition by one of the present inventors that the primary origin of performance degradation in InP HEMTs is the physical degradation of the Schottky junction formed between the gate metal electrode and the underlying semiconductor material in the HEMT structure. The present invention resides in a gate metal electrode that dramatically reduces the degree of Schottky junction degradation in testing at elevated temperatures and, therefore, correspondingly improves the long term reliability of the InP HEMT, whether implemented as a discrete device or in an integrated circuit, such as a MMIC.

More specifically, the present invention is embodied in a gate metal structure that comprises multiple layers of titanium (Ti), platinum (Pt) and gold (Au), as in gate metal structures of the prior art, but which further comprises a thin layer of refractory metal covering the Ti layer at the Schottky junction with a semiconductor layer, specifically the InAlAs barrier of the HEMT structure. In the disclosed embodiments of the invention, the refractory metal may be molybdenum (Mo) or platinum (Pt), such that the gate metal structure includes successive layers of Mo (or Pt), Ti, Pt and Au.

In brief, without the refractory metal layer of the invention, titanium in the gate metal structure diffuses non-uniformly into the InAlAs barrier layer when the structure is exposed to elevated temperatures, producing some regions that are indium rich and others that are indium depleted. In terms of electrical characteristics of the gate junction, the interdiffusion of titanium results in an increase of reverse gate current/ideality factor and a decrease of Schottky barrier height, both of which have adverse effects on performance. With the refractory metal layer of the present invention in place, degradation of the Schottky barrier layer is minimized or eliminated and superior reliability performance is attained even at elevated performance.

Briefly, and in general terms, the indium phosphide (InP) high electron mobility transistor (HEMT) structure of the invention may be defined as comprising a semi-insulating substrate; an epitaxial structure formed on the substrate and comprising a semiconductor channel layer and an overlying semiconductor barrier layer; and a metal gate structure extending into the barrier layer and forming a Schottky junction with the barrier layer. In accordance with the invention, the metal gate structure comprises a first layer of a refractory metal in contact with the barrier layer, and additional layers of metal overlying the first layer. The first layer of the metal gate structure mitigates long-term degradation of the Schottky junction and improves long-term reliability of the HEMT structure.

More specifically, the additional layers of metal in the metal gate structure comprise a second layer of titanium (Ti) overlying the first layer, a third layer of platinum (Pt) overlying the second layer, and a fourth layer of gold (Au) overlying the third layer. In the presently preferred embodiments of the invention, the first layer of the metal gate structure is either molybdenum (Mo) or platinum (Pt). Preferably, the first layer of the gate metal has a thickness of approximately 20-80 Å (angstroms).

It will be appreciated from the foregoing that the present invention represents a significant advance in InP HEMT technology. In particular, with a simple, but critical, change in gate metal structure the invention improves the long-term reliability of InP HEMTs without detracting from their superior performance, whether used as discrete devices or in integrated circuits. Other aspects and advantages of the invention will become apparent from the following more detailed description, taken in conjunction with the accompanying drawings.

DETAILED DESCRIPTION OF THE INVENTION

Figure 1:
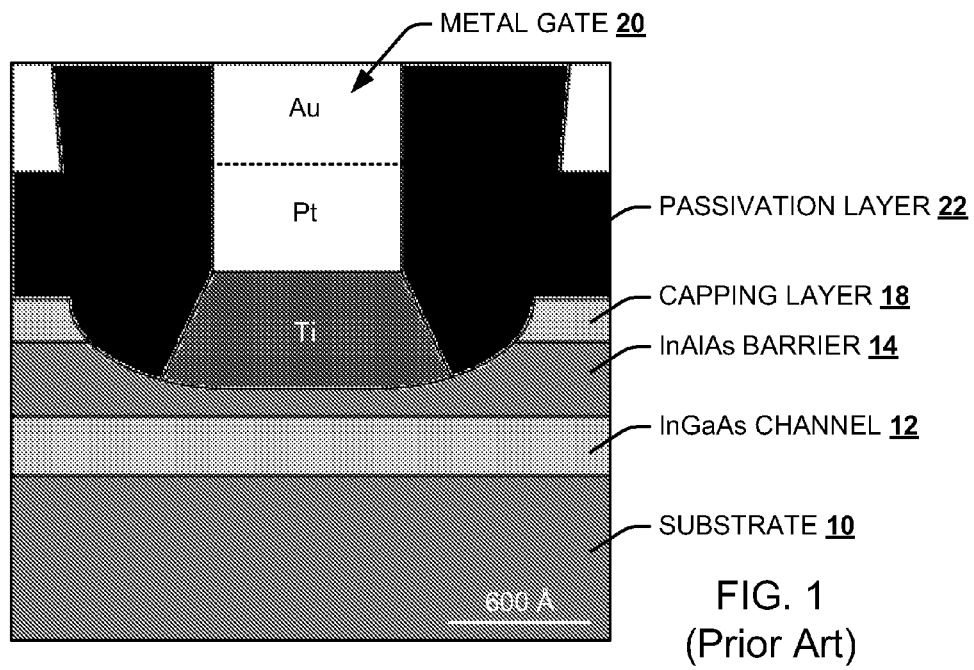
FIG. 1 is a reproduction of a micrograph showing a fragmentary cross section of an InP HEMT of the prior art, prior to testing.

As shown in the drawings for purposes of illustration, the present invention is concerned with high electron mobility transistors (HEMTs) and, more particularly, with HEMTs employing indium phosphide (InP) and related materials. Prior to this invention InP HEMT devices, whether implemented as discrete devices or in integrated circuits such as microwave monolithic integrated circuits (MMICs), have typically included a gate metal structure consisting of three successive layers of titanium (Ti), platinum (Pt) and gold (Au). While it has been widely recognized that InP HEMTs have superior performance at microwave and millimeter wave frequencies, a known disadvantage of the devices is a potential to exhibit degradation in performance over long-term use.

In the past, long-term performance degradation of InP HEMTs has been attributed a variety of degradation mechanisms. Recently, however, it has been shown by the present inventors that degradation of the Schottky junction between the gate metal and the underlying semiconductor layer was the primary origin of performance degradation in InP HEMTs. (See Y. C. Chou et al., "Degradation Analysis of 0.1 μm InP HEMT MMICs Using Low Frequency Noise Characterization," Technical Digest of 16th international Conference of Indium Phosphide and Related Material, pp. 619-622, 2004, the disclosure of which is hereby incorporated by reference into this specification.)

In accordance with the present invention, an InP HEMT includes a gate metal structure with a layer of a refractory metal in addition to the conventional three layers of Ti, Pt and Au. The refractory metal in the presently preferred embodiment of the invention is either molybdenum (Mo) or platinum (Pt). The structural details and advantages of the invention will become apparent from the more detailed discussion that follows.

The processes of 0.1 μm HEMT MMIC technology used in the presently preferred embodiment of the invention have been described elsewhere. (See Y. C. Chou et al., "0.1 μm InGaAs/InAlAs/InP HEMT MMICs—a Flight Qualified Technology," Technical Digest of IEEE GaAs IC Symposium, pp. 77-80, 2002, the disclosure of which is hereby incorporated by reference into this specification.) To explore the degradation characteristics of 0.1 μm InGaAs/InAlAs/InP HEMTs, comprehensive DC (direct current) and RF (radio frequency) measurements were applied to discrete devices and MMICs before and after an elevated temperature lifetest. In addition, several parts tested were withdrawn from testing at intermediate lifetest intervals, for cross-sectioning for subsequent compositional and depth-profile analysis. The analysis technique used is known as "STEM/EDX," which refers to an energy-dispersive X-ray (EDX) mapping system in a scanning transmission electron microscope (STEM). In the analysis, a focused ion-beam (FIB) was used to prepare the cross section.

As further discussed below, this analysis indicates that the Schottky junction between the gate metal and semiconductor (Ti—InAlAs) was the primary degradation origin. The new gate metal electrode technology of the invention was developed to mitigate the Schottky junction degradation observed in 0.1 μm InP HEMTs with Ti/Pt/Au gate metal. Furthermore, the elevated temperature lifetest shows a reliability performance improvement of the new gate structures as compared to conventional Ti/Pt/Au gate devices. Moreover, InP HEMT low noise amplifiers (LNAs) with gate metal stacks structured in accordance with the invention exhibit an RF performance comparable to that of InP HEMT LNAs with conventional Ti/Pt/Au gate metal stacks.

FIG. 1 shows a representation of a scanning-transmission-electron-microscope (STEM) micrograph of a conventional InP HEMT structure prior to undergoing a lifetest at elevated temperatures, and in particular shows an intact Schottky junction. Specifically, the micrograph shows a cross section of the InP HEMT as including a substrate 10, on which is formed a channel layer 12 of indium gallium arsenide (InGaAs). A barrier 14 of indium aluminum arsenide (InAlAs) is formed over the channel layer 12 and a capping layer 18 is formed over the barrier. The epitaxial semiconductor fabrication processes used to form these and other layers in the structure are conventional and well known in the art. It will be appreciated by those skilled in the art that FIG. 1 shows only a pertinent portion of an InP HEMT that includes the gate metal and adjacent structure. Not shown are conventional source and drain metallization layers needed to make electrical contact with the channel 12 through source and drain terminals. In this conventional InP HEMT, the gate metal stack 20 includes a layer of titanium (Ti) extending into the barrier layer 14, an adjacent layer of platinum (Pt) over the titanium, and a layer of gold (Au) over the platinum layer. The gate metal stack 20 is typically surrounded by a passivation layer 22 of silicon nitride or similar material.

Figure 2:
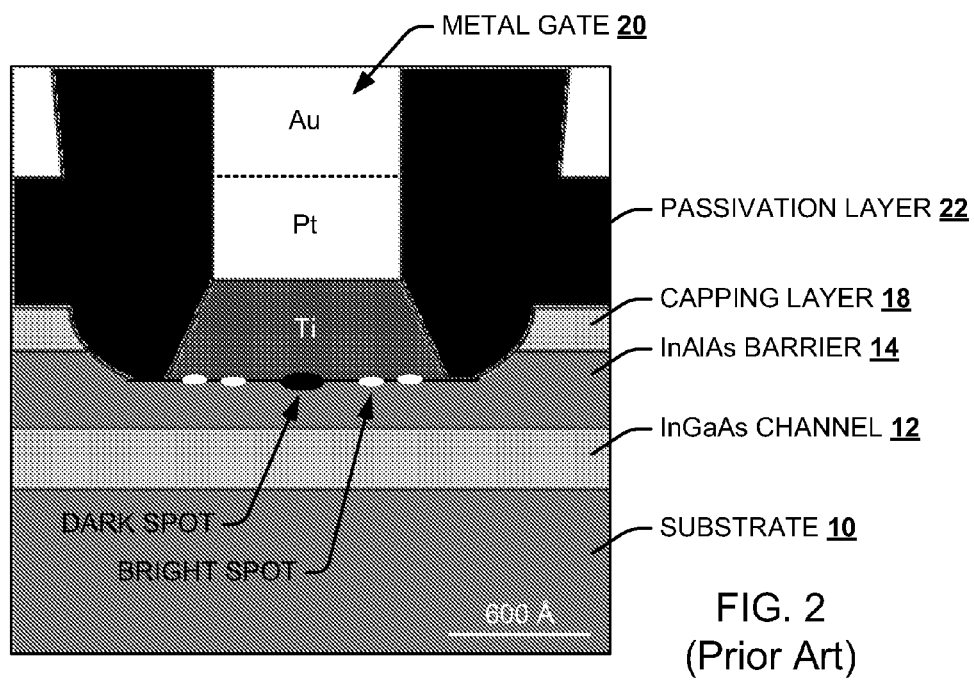
FIG. 2 is a reproduction of a micrograph similar to FIG. 1, but showing degradation that has occurred during lifetesting at an elevated temperature.

FIG. 2 shows a representation of a scanning-transmission-electron-microscope (STEM) micrograph of the same conventional InP HEMT structure as FIG. 1, after being subjected to elevated temperature in a lifetest. The Schottky junction between the titanium in the gate metal stack 20 and the barrier 14 is very evidently degraded as result of the lifetest. Lifetest conditions included a channel temperature, $T_{channel}$, of greater than 220° C., with electrical stress provided by a drain-source voltage and current of Vds =1.3 v and Ids=150 mA/mm. From FIG. 2, it is apparent that degradation appears only in the InAlAs Schottky barrier layer 14 beneath the Ti metal of the gate metal stack 20. Degradation of access regions between gate-source and gate-drain regions is negligible. This implies that Ti gate metal in Ti/Pt/Au metal stack 20 could play an important role of observed Schottky junction degradation as shown in FIG.2.

Figure 3:
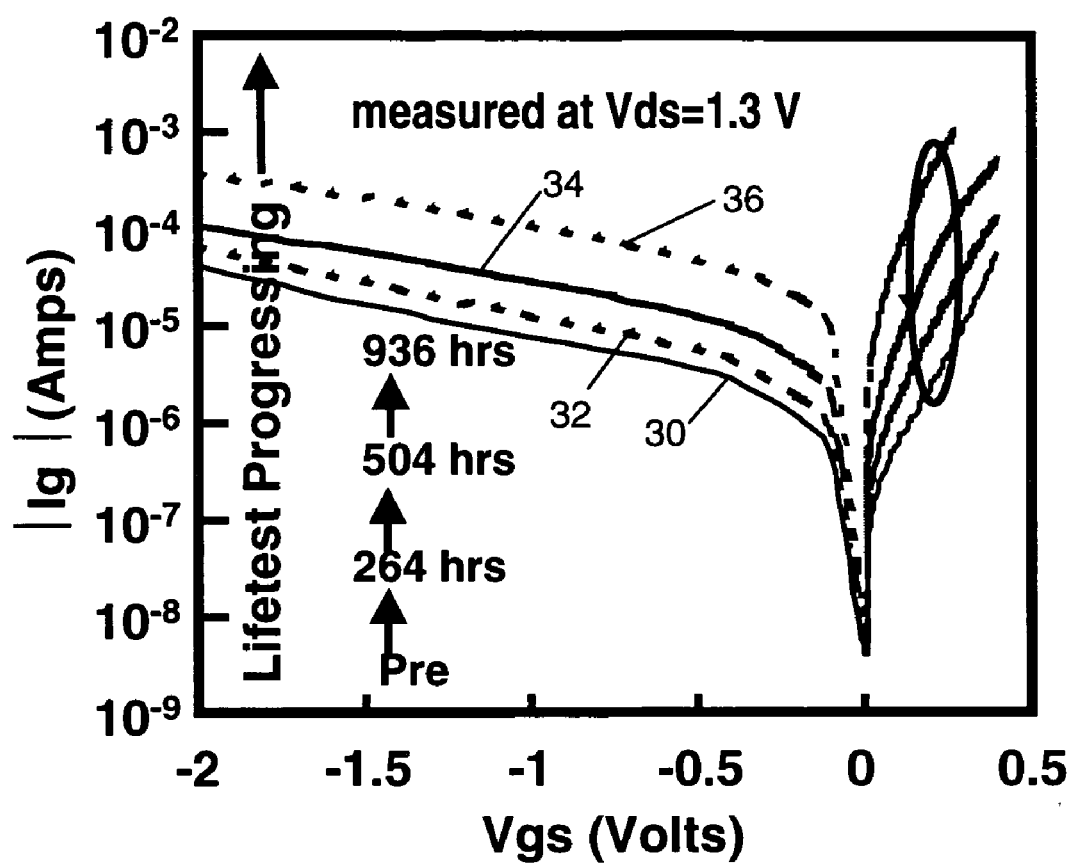
FIG. 3 is set of graphs showing forward and reverse bias diode characteristics of the HEMT of FIG. 1, at various times during lifetesting.

Further electrical characterization of the junction degradation, as shown in FIG. 3, confirms that Schottky junction degradation consists of an increase of reverse gate current/ideality factor, and a decrease of Schottky barrier height. In this figure, the lowest curve 30 depicts the forward-bias and reverse-bias diode characteristics of the conventional HEMT of FIG. 1, i.e., before lifetest of the device. The diode characteristics show the variation of current Ig (plotted along the vertical axis) with gate-source voltage Vgs (plotted along the horizontal axis). The other three curves 32, 34 and 36 in FIG. 3 show the diode characteristic of the conventional device after testing for 264 hours, 504 hours and 936 hours, respectively. As the degradation increases with testing time, the reverse-bias curves show an increase in leakage current, indicative of an increase in the device ideality factor. Similarly, as degradation increases the forward-bias curves also indicate higher current values, indicative of a decrease in Schottky barrier height.

Figure 4:
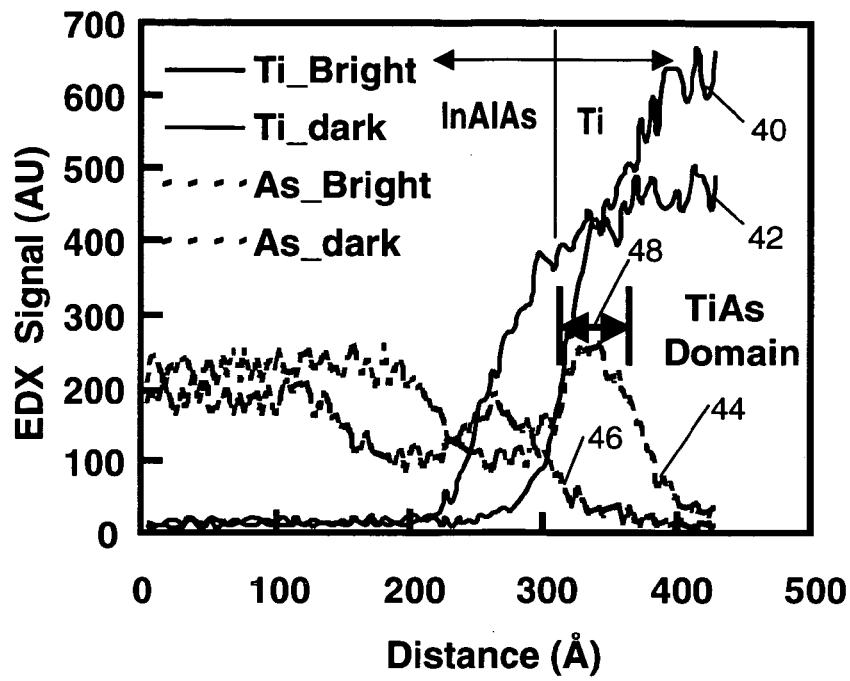
FIG. 4 is a set of graphs showing compositional depth profiles of titanium (Ti) and arsenic (As) with respect to the gate metal-semiconductor junction of the HEMT, and in particular depicting the degree of interdiffusion of Ti and As through the junction.

The spectra (shown in FIGS. 4 and 5) of EDX analysis of dark/light spots (the dark/light spots shown in FIG. 2) reveal the evidence of Ti inter-diffusion and $In_{0.52}Al_{0.48}As$ Schottky layer degradation. The bright spots are slightly Indium rich: $In_{0.52+x}Al_{0.48}As$, and the dark spots are slightly Indium depleted: $In_{0.52-x}Al_{0.48}As$. Consequently, the resultant electrical Schottky junction degradation as shown in FIG. 3 is observed. More specifically, FIG. 4 shows depth profiles of Ti and As across a region of the Ti/InAlAs Schottky junction. The horizontal axis provides a measure of depth with respect to the nominal junction and the vertical axis represents the EDX signal in arbitrary units. In essence, FIG. 4 depicts representative interdiffusion of Ti and As in the bright and dark regions of the junction shown in FIG. 2. Curves 40 and 42 indicate the presence of Ti extending into the InAlAs barrier in dark and bright regions, respectively. Curves 44 and 46 indicate the presence of As extending into the Ti layer in the dark and bright regions, respectively. A portion of the Ti layer closest to the junction is referred to as the TiAs domain 48.

Figure 5:
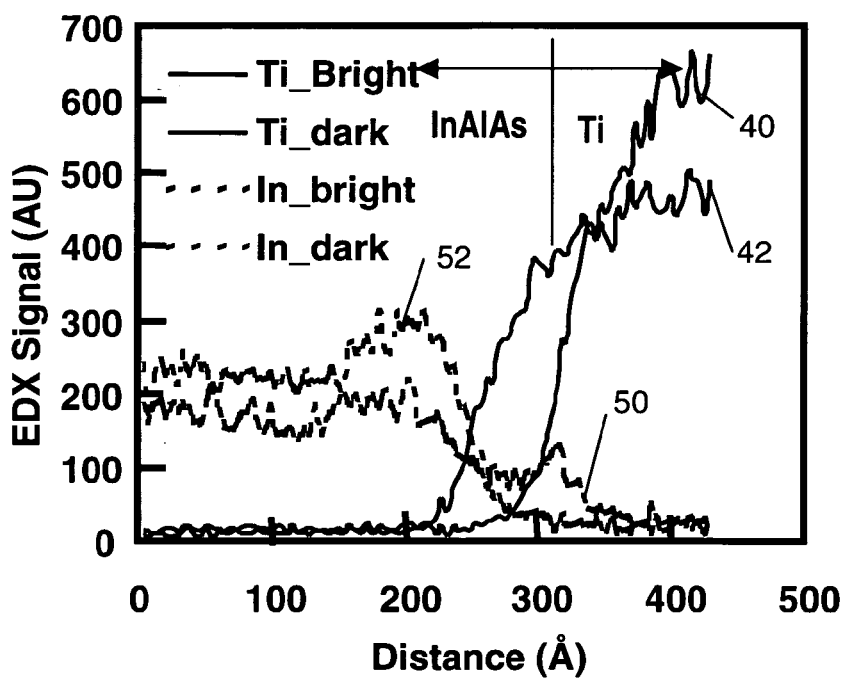
FIG. 5 is a set of graphs similar to FIG. 4 but showing compositional depth profiles of titanium (Ti) and indium (In), and the degree of interdiffusion of Ti and In through the junction.

Similarly to FIG. 4, FIG. 5 depicts interdiffusion of Ti and In through the degraded junction. Curves 40 and 42 are again depicted to show the diffusion of Ti into the InAlAs layer in the dark and bright regions, respectively. Curves 50 and 52 show the diffusion of In into the Ti layer in the dark and bright regions, respectively.

Figure 6:
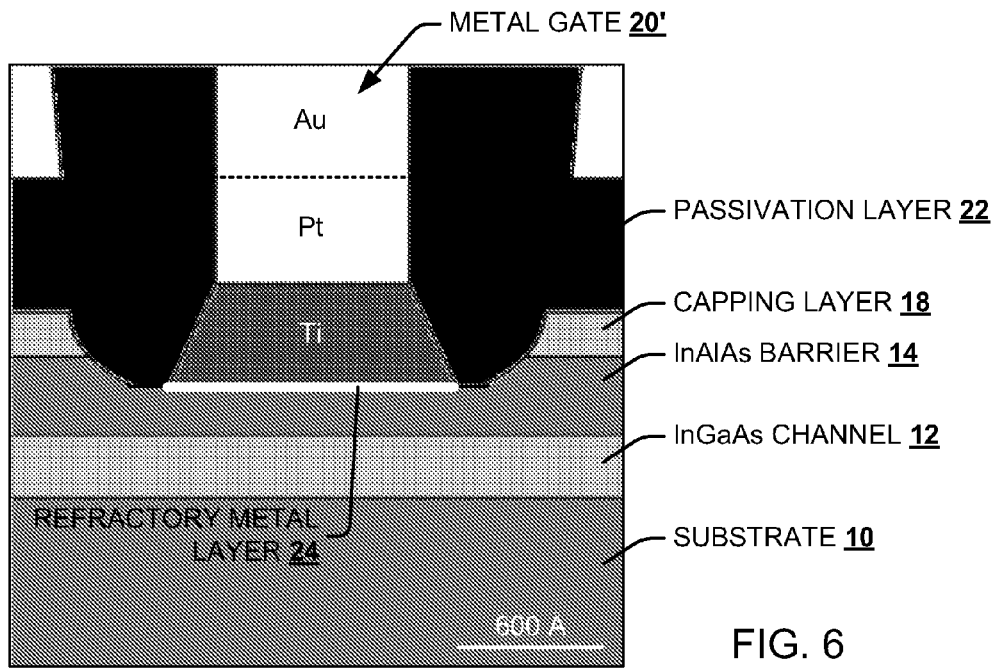
FIG. 6 is a reproduction of a microphotograph showing a fragmentary cross section of an InP HEMT in accordance with the invention.

As shown in FIG. 6, the Schottky junction degradation observed in Ti/Pt/Au gate devices was significantly mitigated on InP HEMTs with new gate metal electrode technology. The illustrated gate metal structure 20' is similar to the metal stack 20 in FIG. 1, with the important exception that the structure of the invention also includes a thin layer 24 of a refractory metal between the Ti layer and the InAlAs barrier 14. In addition to mitigating degradation, devices with the refractory metal layer 24 also preserve good controllability of gate length, recess size, and gate metal shape. As a result, devices with new gate metal electrode still retain similar DC and RF performance to that of devices with base line conventional Ti/Pt/Au gate metal stacks.

The presently preferred material for the refractory metal layer 24 is either molybdenum (Mo) or platinum (Pt), but other suitable metals exhibiting stability at elevated temperatures may potentially be used. Ideally, the refractory metal layer 24 should be relatively thin. For example, a layer thickness in the range 20-80 Å (angstroms), or 0.002-0.008 μm, provides good results. A greater thickness can result in mechanical stresses in the metal stack 20'. By way of contrast, the other metal layers in a conventional tri-metal Ti/Pt/Au gate metal stack are each typically about 400 Å (0.04 μm) thick for Ti/Pt and 7000 Å (0.7 μm) thick for Au.

Figure 7:
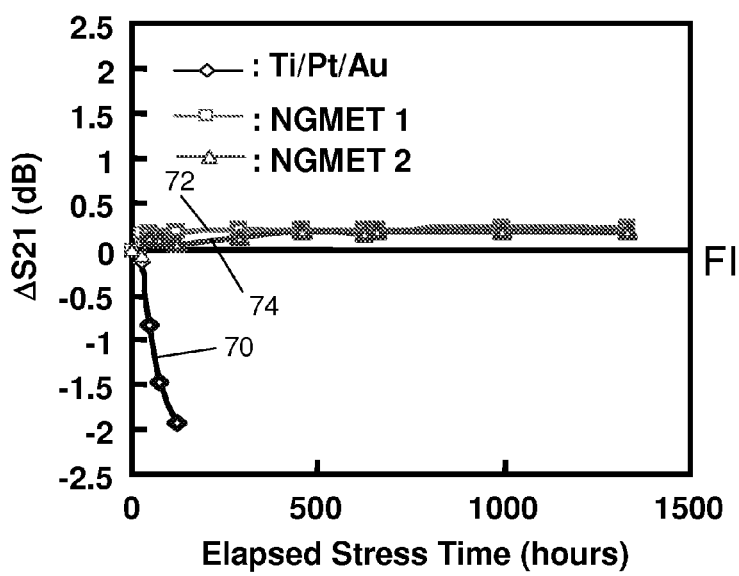
FIG. 7 is a set of graphs comparing the long-term performance degradation of an InP HEMT of the prior art with the long-term performance of two embodiments of the an InP HEMT of the present invention.

The elevated temperature lifetest substantiates that the reliability performance, improvement of InP HEMTs with the new gate metal devices, as compared to Ti/Pt/Au gate devices, can be achieved, as shown in FIG. 7. The graphs in FIG. 7 plot the variation of performance degradation, as measured in this instance as amplifier gain (S21), plotted in dB along the vertical axis, with elapsed time in a stress test such as a lifetest at elevated temperature. The gain degradation of a low noise amplifier (LNA) using conventional a tri-metal gate structure is indicated by curve 70, and shows a relatively rapid decline in performance over the first 100-200 hours of testing. Curves 72 and 74, which are almost coincident with each other, depict the variation in amplifier gain for LNAs incorporating the new gate metal structures. It will be observed that the new gate metal LNAs exhibit virtually no degradation in amplifier performance over as long as 1,400 hours of testing.

Similar results, in terms both of mitigation of Schottky junction degradation and of reliability performance were observed on devices using the two preferred additional gate metal layers (Mo and Pt). To assure that RF performance of 0.1 μm InP HEMT MMICs with the new gate metal is not adversely affected, 2-stage balanced K-band (18-26 GHz) InP HEMT low-noise amplifiers (LNAs) with the new gate metals were fabricated and compared to LNAs with the conventional Ti/Pt/Au gate metal. The measurement results showed that the gain and noise figure performance of 0.1 μm InP HEMT MMICs with either of the preferred new gate metals is comparable to that of LNAs with Ti/Pt/Au gate metal. (For example, a gain of 16-18 dB (decibels) and a noise figure of approximately 2.5 dB at a frequency of 35 GHz.)

It will be appreciated from the foregoing that the present invention represents a significant advance in HEMT technology. In particular, the invention provides an easily fabricated 0.1 μm InP HEMT device that alleviates Schottky junction degradation, improves reliability, and provides good RF performance. It will also be appreciated that although specific embodiments of the invention have been illustrated and described in detail for purposes of illustration, various modifications may be made without departing from the spirit and scope of the invention. Accordingly, the invention should not be limited except as by the appended claims.

The invention claimed is:

1. An indium phosphide (InP) high electron mobility transistor (HEMT) structure having improved long-term performance, the HEMT structure comprising:
   a semi-insulating substrate;

an epitaxial structure formed on the substrate and comprising a semiconductor channel layer and an overlying semiconductor barrier layer;

a metal gate structure extending into the barrier layer and forming a Schottky junction with the barrier layer, wherein an electrical voltage applied to the metal gate structure controls current flow in the channel layer, and wherein the metal gate structure comprises:

a first layer in contact with the barrier layer, the first layer of the metal gate structure being molybdenum (Mo); and three additional layers of metal overlying the first layer;

and wherein the first layer of the metal gate structure mitigates long-term degradation of the Schottky junction and improves long-term reliability of the HEMT structure.

2. An InP HEMT structure as defined in claim 1, wherein the three additional layers of metal in the metal gate structure comprise:

a second layer overlying the first layer, the second layer being titanium (Ti), a third layer overlying the second layer, the third layer being platinum (Pt), and a fourth layer overlying the third layer, the forth layer being gold (Au).

3. An InP HEMT structure as defined in claim 1, wherein the first layer of the metal gate structure has a thickness of approximately 20-80 Å (angstroms).

4. An InP HEMT structure as defined in claim 1, wherein:

the semi-insulating substrate is fabricated from indium phosphide (InP);

the channel layer is fabricated from indium gallium arsenide (InGaAs); and the barrier layer is fabricated from indium aluminum arsenide (InAlAs).

5. An InP HEMT structure as defined in claim 4, and further comprising:

a capping layer formed over the barrier layer, the capping layer being fabricated from indium gallium arsenide (InGaAs).

6. An indium phosphide (InP) high electron mobility transistor (HEMT) structure having improved long-term performance, the HEMT structure comprising:

a semi-insulating substrate of indium phosphide (InP);

an epitaxial structure formed on the substrate and comprising a semiconductor channel layer of indium gallium arsenide (InGaAs) and an overlying semiconductor barrier layer of indium aluminum arsenide (InAlAs);

a metal gate structure extending into the barrier layer and forming a Schottky junction with the barrier layer, wherein an electrical voltage applied to the metal gate structure controls current flow in the channel layer, and wherein the metal gate structure comprises:

a first layer of metal in contact with the barrier layer, the first layer of metal being a refractory metal, a second layer of metal overlying the first layer, the second layer of metal being titanium (Ti), a third layer of metal overlying the second layer, the third layer of metal being platinum (Pt), and a fourth layer of metal overlying the third layer, the fourth layer of metal being gold (Au);

and wherein the first layer of the metal gate structure mitigates long-term degradation of the Schottky junction and improves long-term reliability of the HEMT structure.

7. An InP HEMT structure as defined in claim 6, wherein the first layer of the metal gate structure is molybdenum (Mo).

8. An InP HEMT structure as defined in claim 6, wherein the first layer of the metal gate structure has a thickness in the range of approximately 20-80 Å (angstroms).

9. An InP HEMT structure as defined in claim 1, wherein the three additional layers of metal in the metal gate structure comprise:

a second layer overlying the first layer, the second layer having a thickness of about 400 Å (angstroms);

a third layer overlying the second layer, the third layer having a thickness of about 400 Å (angstroms); and a fourth layer overlying the third layer, the fourth layer having a thickness of about 7000 Å (angstroms).

10. An InP HEMT structure as defined in claim 3, wherein the three additional layers have a total combined thickness of greater than or equal to about 400 Å (angstroms).

11. An InP HEMT structure as defined in claim 6, wherein the three additional layers of metal in the metal gate structure comprise:

a second layer overlying the first layer, the second layer having a thickness of about 400 Å (angstroms);

a third layer overlying the second layer, the third layer having a thickness of about 400 (angstroms); and a fourth layer overlying the third layer, the fourth layer having a thickness of about 7000 Å (angstroms).

12. An InP HEMT structure as defined in claim 8, wherein the second layer, the third layer, and the fourth layer have a total combined thickness of greater than or equal to about 400 Å (angstroms).

* * * * *

UNITED STATES PATENT AND TRADEMARK OFFICE
CERTIFICATE OF CORRECTION

PATENT NO.        : 7,411,226 B2                                    Page 1 of 1
APPLICATION NO.   : 11/115938
DATED             : August 12, 2008
INVENTOR(S)       : Yeong-Chang Chou et al.

It is certified that error appears in the above-identified patent and that said Letters Patent is hereby corrected as shown below:

Cover Page item (75) Inventors: delete "Yeong-Chang Choug" and insert --Yeong-Chang Chou--

Signed and Sealed this

Fourth Day of November, 2008

JON W. DUDAS
*Director of the United States Patent and Trademark Office*